United States Patent [19]
Kato

[11] Patent Number: 5,951,692
[45] Date of Patent: Sep. 14, 1999

[54] SINGLE-CHIP MEMORY SYSTEM HAVING A REDUNDANCY JUDGING CIRCUIT

[75] Inventor: Kunihiko Kato, Tokyo, Japan

[73] Assignee: NEC Corporation, Tokyo, Japan

[21] Appl. No.: 08/788,249

[22] Filed: Jan. 27, 1997

[30] Foreign Application Priority Data

Jan. 30, 1996 [JP] Japan .................................. 8-013871

[51] Int. Cl.⁶ .................................................. G06F 11/00
[52] U.S. Cl. ................................................................ 714/6
[58] Field of Search ....................... 395/182.03, 182.04, 395/183.06, 182.09; 371/40.11, 40.4, 40.12, 10.2, 10.3

[56] References Cited

U.S. PATENT DOCUMENTS

| | | | |
|---|---|---|---|
| 4,601,019 | 7/1986 | Shah et al. | 371/21.1 |
| 4,608,687 | 8/1986 | Dutton | 395/182.04 |
| 5,228,046 | 7/1993 | Blake et al. | 395/182.03 |
| 5,402,377 | 3/1995 | Ohhata et al. | 371/10.2 |

FOREIGN PATENT DOCUMENTS

| | | |
|---|---|---|
| 3198289 | 8/1991 | Japan . |
| 3198290 | 8/1991 | Japan . |

*Primary Examiner*—Robert W. Beausoliel, Jr.
*Assistant Examiner*—Pierre Eddy Elisca
*Attorney, Agent, or Firm*—McGinn & Gibb, P.C.

[57] ABSTRACT

To use both an array of main memory cells and an array of redundant memory cells efficiently during a block writing operation, a memory system for performing the block writing operation includes a bit line activator activating at least one bit line of bit lines of the array of main memory cells and at least one bit line of bit lines of the array of redundant memory cells simultaneously during the block writing operation.

20 Claims, 6 Drawing Sheets

SINGLE-CHIP MEMORY SYSTEM HAVING A REDUNDANCY JUDGING CIRCUIT

BACKGROUND OF THE INVENTION

The present invention generally relates to a memory system including a block writing function, and more particularly to a memory system including a redundancy judging circuit for judging whether redundant memory cells are used or not.

DESCRIPTION OF THE RELATED ART

A memory system having a block writing function is used, especially, for displaying graphics in a display (e.g., monitor). When block writing occurs, the memory system can write data to a plurality of columns simultaneously. Therefore, the memory system can write data faster than a memory system having no block writing function because the memory system having no block writing function must access each of a plurality of columns sequentially as opposed to simultaneously.

FIG. 1 shows a conventional memory system including a single-chip memory device 1. The memory device includes an array of main memory cells 2 and an array of redundant memory cells 4, each of these arrays being constructed as a dynamic random access memory (DRAM). Therefore, each of the memory cells has an N-type (MOS) transistor and a capacitor for storing data.

The single-chip memory device 1 has sixteen input terminals 13 for receiving eight row address signals and eight column address signals A0T–A7T (e.g., A0T is the least significant bit (LSB) and A7T is the most significant bit (MSB)). Therefore, the array of main memory cells 2 is provided as an array of 64 kbit memory cells.

The memory device 1 also includes input terminals for receiving a row address strobe (RAS) signal, a column address strobe (CAS) signal and a write enable (WE) signal. A block writing signal generator 11 outputs a block writing signal 3 and changes the signal 3 to an active high level (e.g., "1") from an inactive low level (e.g., "0") when each of the RAS, CAS and WE signals has a special timing representing a block writing operation.

A redundancy judging circuit 15 receives five column address signals A3T–A7T and outputs a judging signal 301. The circuit 15 changes judging signal 301 to an active high level from an inactive low level when the column address signals A3T–A7T represent a redundant address.

FIG. 2 illustrates the circuit 15 in detail, which includes a P-type MOS transistor Tr340 for pre-charging a line for transmitting the judging signal 301, fuses 310–319 for selecting a redundant address and MOS transistors Tr310–Tr319. Each of the gates of Tr310, Tr312, Tr314, Tr316 and Tr318 receives each of the address signals A3T–A7T. Each of the gates of Tr311, Tr313, Tr315, Tr317 and Tr319 receives each of the address signals A3T–A7T having been inverted by invertors 320–324. For example, fuses 311, 312, 315, 316 and 318 are cut at the testing step for the array of main memory cells of producing steps of the chip 1 when (A3T, A4T, A5T, A6T, A7T)=(0, 1, 0, 1, 1) is a redundant address.

Each of a plurality of bit line activators 10-1–10-8 is constructed corresponding to each of the bit lines of the array of redundant memory cells 4 and activates one of the bit lines corresponding to the respective activator when judging signal 301 has a high level. In FIG. 2, the array of redundant memory cells 4 has eight bit lines.

A register 9 stores data for block writing that is stored before the block writing operation (explained below) is performed.

A random I/O buffer 12 receives the WE signal and block writing signal 3. Buffer 12 transmits data for writing to memory cells in arrays 2, 4 from I/O terminals 14 to a sense amplifier 7 or a sense amplifier 8 when the WE signal has an active high level and block writing signal 3 has a low level. Buffer 12 transmits data read from memory cells in arrays 2, 4 from sense amplifier 7 or 8, respectively, to I/O terminals 14 when the WE signal has an inactive low level and block writing signal 3 has a low level.

When block writing signal 3 has a high level, the buffer 12 transmits data from register 9 to sense amplifier 7 or 8. Simultaneously, buffer 12 transmits column mask signals CM0–CM7 from I/O terminals 14 having eight terminals to a column decoder 6.

A row decoder 5 decodes the row address signals A0T–A7T when the RAS signal changes to an active high level from an inactive low level, and activates one word line of a plurality of word lines in arrays 2 and 4.

Column decoder 6 receives column address signals A0T–A7T, a CAS signal, block writing signal 3, column mask signals CM0–CM7 and an inverted judging signal 301. The column decoder 6 is activated and becomes operative when judging signal 301 has a low level, and is not activated when judging signal 301 has a high level because bit line activators 10-1–10-8 for the redundant memory cells are activated. Hereinbelow, the operation of the decoder 6 is described.

When the CAS signal changes to an active high level from an inactive low level and block writing signal 3 has a low level, decoder 6 decodes column address signals A0T–A7T and activates one bit line of a plurality of bit lines in array 2. Therefore, one memory cell is selected for writing data.

When the CAS signal changes to a high level from a low level and block writing signal 3 has a high level, decoder 6 disregards address signals A0T–A2T and decodes address signals A3T–A7T. Therefore, eight bit lines (e.g., bit lines B0–B7) are activated simultaneously, and the same data is written to eight memory cells (e.g., this operation is called a "block writing operation"). At this time, it is impossible to write data to some memory cells of the eight memory cells by using column mask signals CM0–CM7. Each of column mask signals CM0–CM7 corresponds with each bit line of the bit lines B0–B7. Therefore, decoder 6 does not activate some bit lines when corresponding mask signals have an active high level. For example, decoder 6 does not activate bit line B0 when mask signal CM0 has an active high level. It is impossible that every column mask signal becomes an inactive low level because at least one of column mask signals CM0–CM7 is activated during the block writing operation.

Thus, the memory system of the chip 1 described above performs the block writing operation.

However, if a wrong (erroneous) bit line exists in the array of main memory cells 2 and fuses of redundancy judging circuit 15 corresponding to the column address containing the wrong bit line are cut, every data of 8 bits (e.g., all eight bit lines B0–B7) is written to the array of redundant memory cells 4 even if only one bit line of the eight bit lines is wrong. Although the seven bit lines of the eight bit lines (e.g., all but the wrong bit line) are essentially useful for writing data, they are not used for writing data during the block writing operation. Therefore, the chip 1 does not operate efficiently and the chip size is unduly large because there are many memory cells that are essentially operable but are not usable during the block writing operation.

SUMMARY OF THE INVENTION

In view of the foregoing problems of the conventional memory system, it is therefore an object of the present invention to provide an improved memory system having a block writing function.

It is another object of the present invention to provide an improved redundancy judging circuit for judging whether a bit line of an array of redundant memory cells is used or not.

It is a further object of the present invention to provide an improved column decoder for activating bit lines of an array of main memory cells.

In a first aspect, a memory system according to the present invention includes an array of main memory cells, an array of redundant memory cells and an apparatus for activating at least one bit line of the array of main memory cells and at least one bit line of the array of redundant memory cells during a block writing operation.

With the unique and unobvious structure of the present invention, the array of main memory cells are usable even when using (e.g., writing to) the redundancy memory cells during the block writing operation. Therefore, the bit lines of the array of main memory cells are used more efficiently and the system size can be made smaller, as compared to the conventional memory system.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
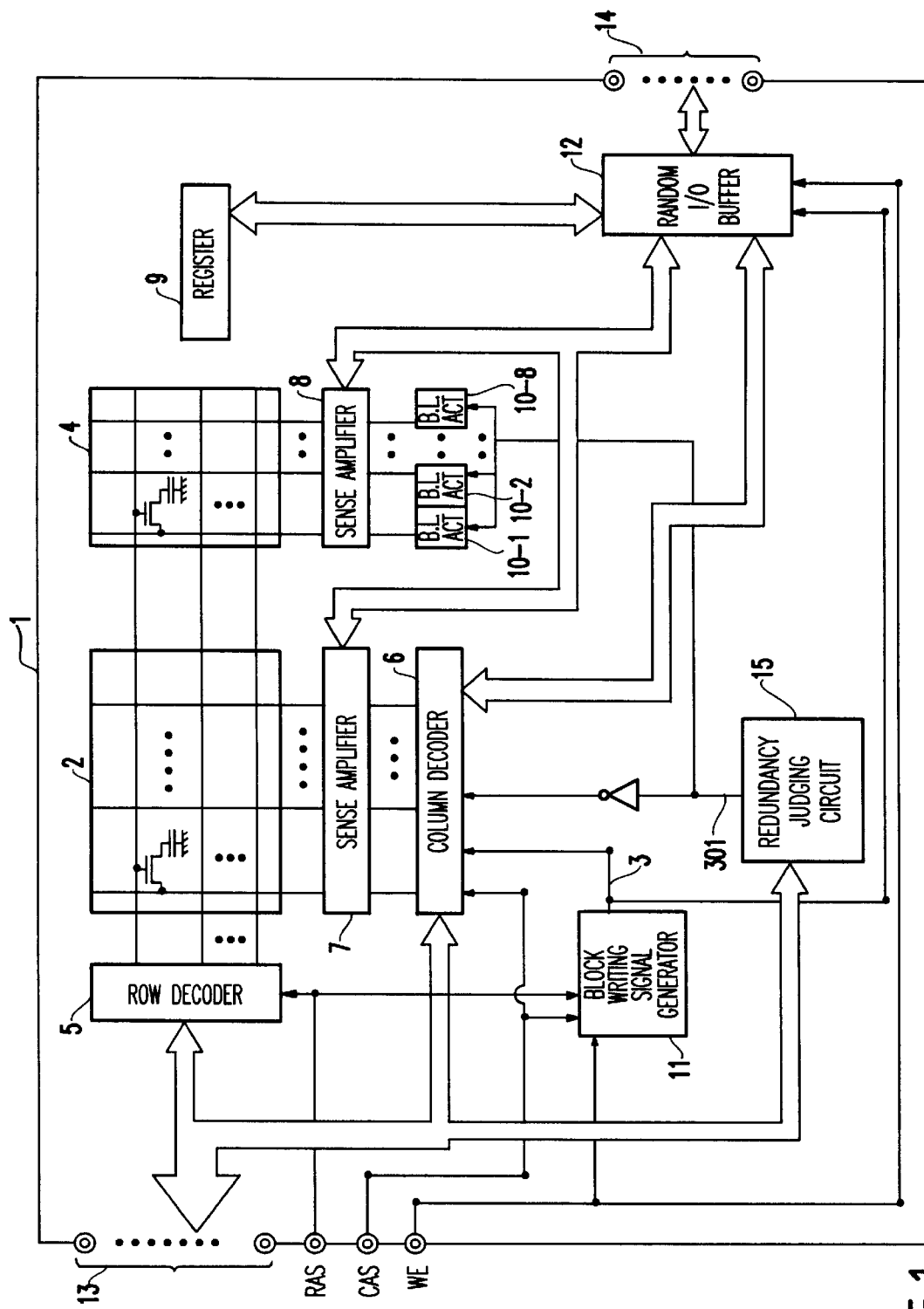
FIG. 1 is a diagram showing a conventional memory system.
Figure 2:
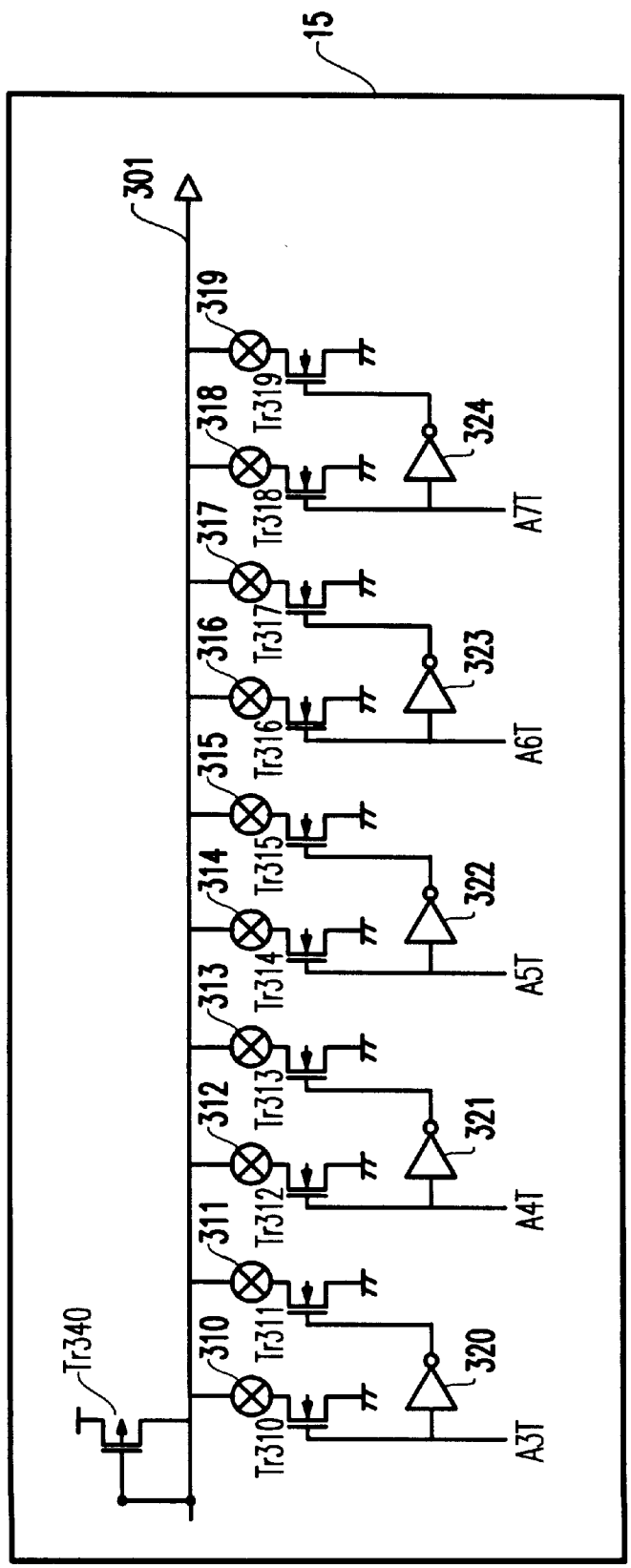
FIG. 2 is a circuit diagram showing a redundancy judging circuit 15 in the memory system of FIG. 1.
Figure 3:
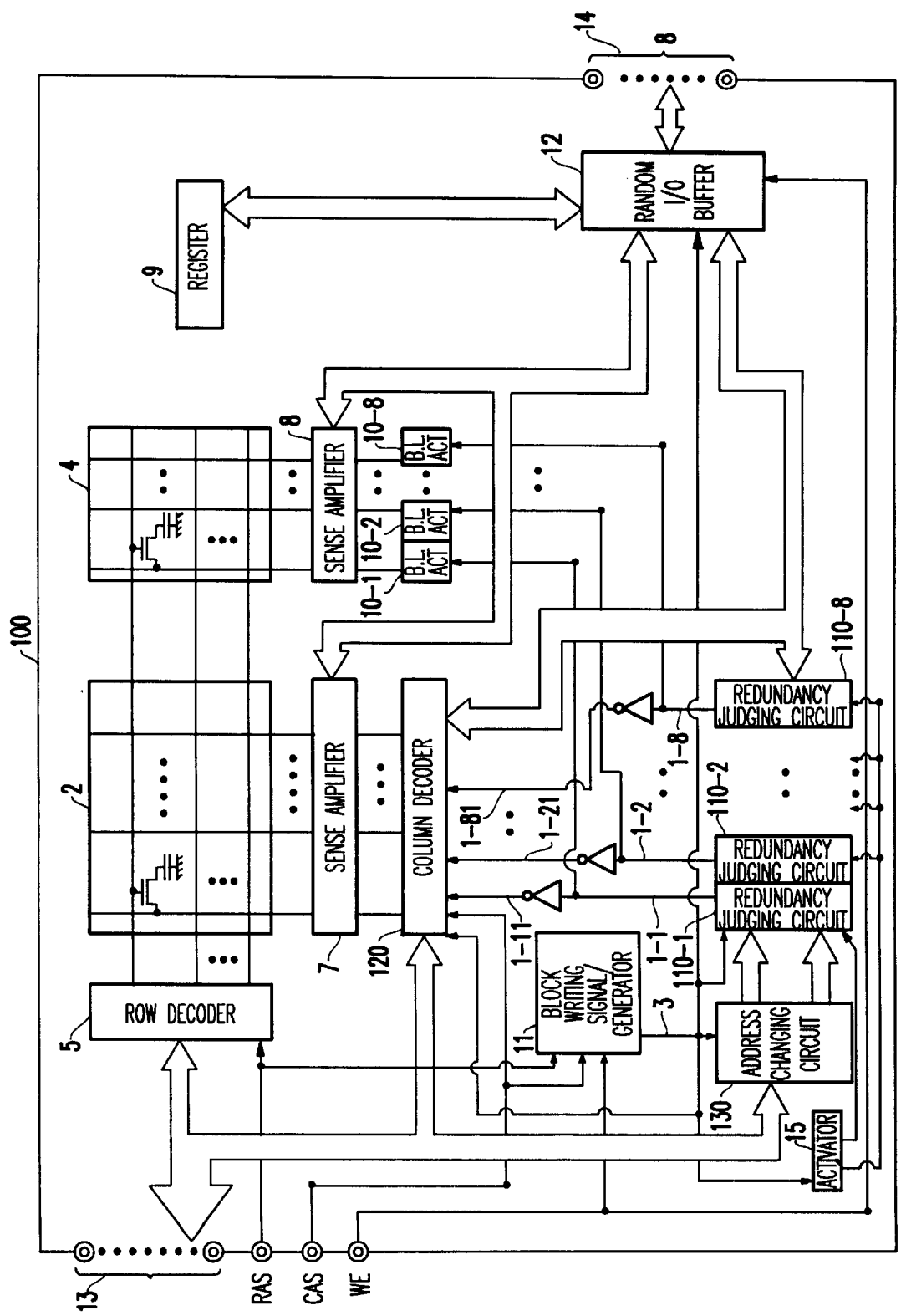
FIG. 3 is a diagram showing a memory system according to the present invention.

Referring now to the drawings, and more particularly to FIG. 3, a single-chip semiconductor memory system 100 has a block writing function according to a first embodiment of the present invention. The same parts in FIG. 3 as those in FIG. 1 are numbered with the same reference numerals in FIG. 1 and for brevity explanations of these parts are omitted from the following explanation.

As shown in FIG. 3, an address changing circuit 130 is provided for receiving column address signals A0T–A7T and always outputs column address signals A3T–A7T to redundancy judging circuits 110-1–110-8. The circuit 130 also outputs column address signals A0T–A2T and A0N–A2N, which represent inverted signals A0T–A2T, to redundancy judging circuits 110-1–110-8 when block writing signal 3 has a low level. When block writing signal 3 has a high level, the circuit 130 changes signals A0T–A2T and A0N–A2N to a low level.

Figure 4:
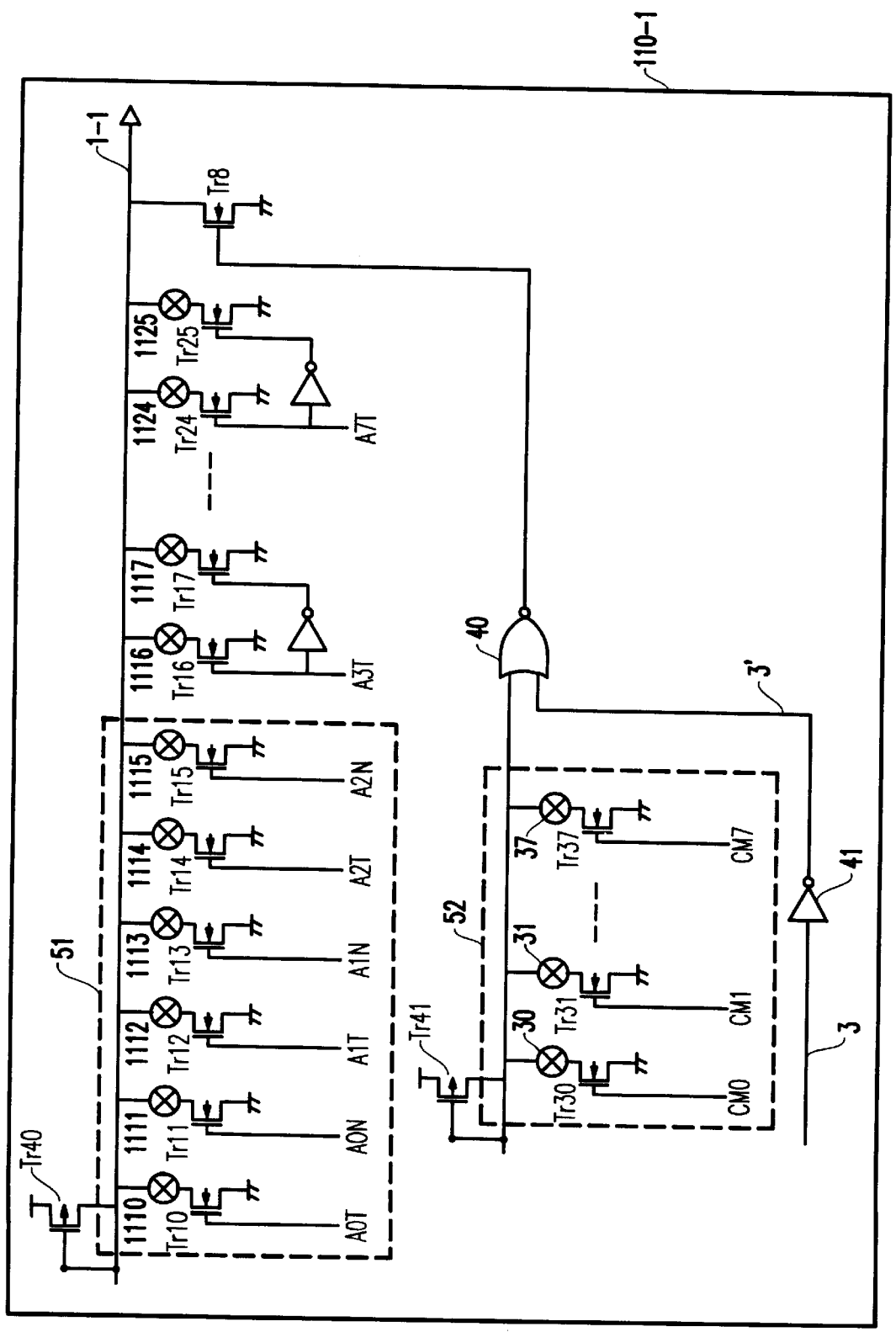
FIG. 4 is a circuit diagram showing a redundancy judging circuit 110-1 of a first embodiment according to the present invention.

Redundancy judging circuits 110-1–110-8 each have the same construction as shown in FIG. 4, and are connected to each of bit line activators 10-1–10-8. Each of the circuits 110-1–110-8 receives block writing signal 3, column address signals A0T–A7T and signals A0N–A2N, and outputs judging signals 1-1–1-8, respectively. However, only one of these circuits 110-1–110-8 is activated when block writing signal 3 has a low level because judging circuit activator 15 activates circuit 110-1 and does not activate the other circuits 110-2–110-8 when the block writing signal has a low level.

For example, if the circuit 110-1 is designed to be activated when block writing signal 3 has a low level, the remaining circuits 110-2–110-8 cannot make judging signals 1-2–1-8 have a high level (e.g., activate) at this time. However, all of circuits 110-1–110-8 can make judging signals 1-1–1-8 have a high level when block writing signal 3 has a high level because judging circuit activator 15 activates all of the circuits 110-1–110-8 when the block writing signal has a high level. Circuit 110-1 is explained below as a representative circuit because circuits 110-1–110-8 each have the same construction as shown in FIG. 4.

FIG. 4 illustrates circuit 110-1 in detail, which includes a P-type MOS transistor Tr40 for pre-charging a line transmitting judging signal 1-1, fuses 1110–1125 for selecting the redundant address and N-type MOS transistors Tr10–Tr25. Each of the gates of Tr16, Tr18, Tr20, Tr22 and Tr24 receives signals A3T–A7T. Each of the gates of Tr17, Tr19, Tr21, Tr23 and Tr25 receives address signals A3T–A7T having been inverted by respective invertors (unreferenced). Further, a low-order bit circuit 51 is for deciding a redundant address of the lowest 3 bits. Each of the gates of Tr10, Tr12 and Tr14 of the circuit 51 receives address signals A0T–A2T, and each of the gates of Tr11, Tr13 and Tr15 of the circuit 51 receives signals A0N–A2N.

The circuit 110-1 further includes a P-type MOS transistor Tr41 for precharging a column mask signal receiving circuit 52, invertor 41 for receiving block writing signal 3 and for outputting an inverted signal 3', a NOR circuit 40 for receiving the output of invertor 41 and the output of the circuit 52, and an N-type MOS transistor Tr8 having a gate for receiving the output of NOR circuit 40. A source-drain path of transistor Tr8 is connected to the line transmitting judging signal 1-1.

When block writing signal 3 has a low level, transistor Tr8 is "OFF", thereby not making the source-drain path. At this time, the circuit 51 receives column address signals A0T–A2T and inverted signals A0T–A2T (e.g., signals A0N–A2N). For example, fuses 1111, 1113, 1115, 1117, 1118, 1120, 1122 and 1124 are cut during the testing step of the array of main memory cells when producing the chip 100, when (A0T, A1T, A2T, A3T, A4T, A5T, A6T, A7T)=(0, 0, 0, 0, 1, 0, 1, 1) is a redundant address. At this time, if the circuit 110-1 receives address signals (A0T, A1T, A2T, A3T, A4T, A5T, A6T, A7T)=(0, 0, 0, 0, 1, 0, 1, 1), the circuit 110-1 outputs judging signal 1-1 which has a high level. Therefore, bit line activator 10-1 activates a corresponding bit line regardless of whether bit line activators 10-2–10-8 are activated or not.

When block writing signal 3 has a high level, the memory system of the chip 100 performs a block writing operation. Therefore, the circuit 51 receives signals A0T–A2T and A0N–A2N (all having a low level) because the lowest 3 bits (A1T, A2T, A3T)=(0, 0, 0) of the column address signals must be disregarded (not considered). Therefore, the circuit 110-1 makes judging signal 1-1 a low level if it receives address signals other than signals (A3T, A4T, A5T, A6T, A7T)=(0, 1, 0, 1, 1) because such address signals do not represent a redundant address.

When the circuit 110-1 receives redundant address signals (A3T, A4T, A5T, A6T, A7T)=(0, 1, 0, 1, 1), the circuit 110-1 can make judging signal 1-1 either a high level or a low level. If all fuses 30–37 of the circuit 52 are cut, the signal 1-1 has a high level when the circuit 110-1 receives a redundant address. However, if all fuses 30–37 of the circuit 52 are not cut, the signal 1-1 has a low level at that time because at least one of column mask signals CM0–CM7 has a high level. Therefore, NOR circuit 40 outputs a high level signal, and transistor Tr8 always turns "ON" during the block writing operation.

A column decoder 120 receives column address signals A0T–A7T, column mask signals CM0–CM7, the CAS signal, block writing signal 3 and signals 1-11–1-81 representing inverted judging signals 110-1–110-8. When block writing signal 3 has a low level, column decoder 120 operates as described below.

Specifically, column decoder 120 receives only one of the signals 1-11–1-81. For example, column decoder 120 receives signal 1-11 from redundancy judging circuit 110-1 and disregards the other seven signals 1-21–1-81. Decoder 120 is activated and becomes operative when judging signal 1-1 has a low level, but is not activated when judging signal 1-1 has a high level. When the CAS signal changes to an active high level from an inactive low level and block writing signal 3 has a low level, decoder 120 decodes column address signals A0T–A7T, and activates one bit line of a plurality of bit lines in array 2. Therefore, one memory cell is selected for writing data.

When the CAS signal changes to a high level from a low level and block writing signal 3 has a high level, decoder 120 disregards address signals A0T–A2T, and decodes address signals A3T–A7T. Therefore, eight bit lines (e.g., bit lines B0–B7) are selected by decoder 120 simultaneously, and the same data may be written simultaneously to eight memory cells (e.g., a block writing operation). At this time, it is impossible to write data to only some memory cells of the eight memory cells by using column mask signals CM0–CM7. Column mask signals CM0–CM7 respectively correspond to bit lines B0–B7. Therefore, decoder 120 does not activate some bit lines when corresponding mask signals have an active high level. For example, decoder 120 does not activate bit line B0 when mask signal CM0 has an active high level. Therefore, at this time, data is not written to the memory cell connected to bit line B0.

Further, at this time, decoder 120 receives signals 1-11–1-81 which respectively correspond to bit lines B0–B7. For example, when redundancy judging circuit 110-1 outputs judging signal 1-1 having a low level, column decoder 120 activates bit line B0 because signal 1-11 has a high level. However, when the signal 1-1 has a high level, decoder 120 does not activate bit line B0 because signal 1-11 has a low level. Therefore, data is not written to the bit line B0.

Column decoder 120 activates bit line B1 when signal 1-21 has a high level and does not activate bit line B1 when signal 1-21 has a low level. The other six bit lines B2–B7 are activated depending on levels of signals 1-31–1-81 similarly to bit lines B0 and B1, as discussed above.

As mentioned above, column decoder 120 can activate each of bit lines B0–B7 independently depending on respective levels of signals 1-11–1-81, and each of bit line activators 10-1–10-8 operates independently depending on levels of judging signals 1-1–1-8, respectively. Therefore, data may be written to both arrays of main memory cells 2 and of redundant memory cells 4 simultaneously during a block writing operation when column address signals indicate a redundant address.

For example, when column address signals (A0T, A1T, A2T, A3T, A4T, A5T, A6T, A7T)=(0, 0, 0, 0, 1, 0, 1, 1) represent a redundant address, column address signals (A3T, A4T, A5T, A6T, A7T)=(0, 1, 0, 1, 1) also represent the redundant address during the block writing operation. At this time, bit line B0 of bit lines B0–B7 has an abnormality or problem (e.g., line is cut or broken). Therefore, all fuses 30–37 of redundancy judging circuit 110-1 are cut, and all fuses of redundancy judging circuits 110-2–110-8 corresponding to fuses 30–37 of FIG. 4 are maintained (e.g., not cut). With the above construction, data are written to bit lines B1–B7 of the array of main memory cells 2 and to bit line(s) connected to bit line activator 10-1 during the block writing operation.

Figure 5:
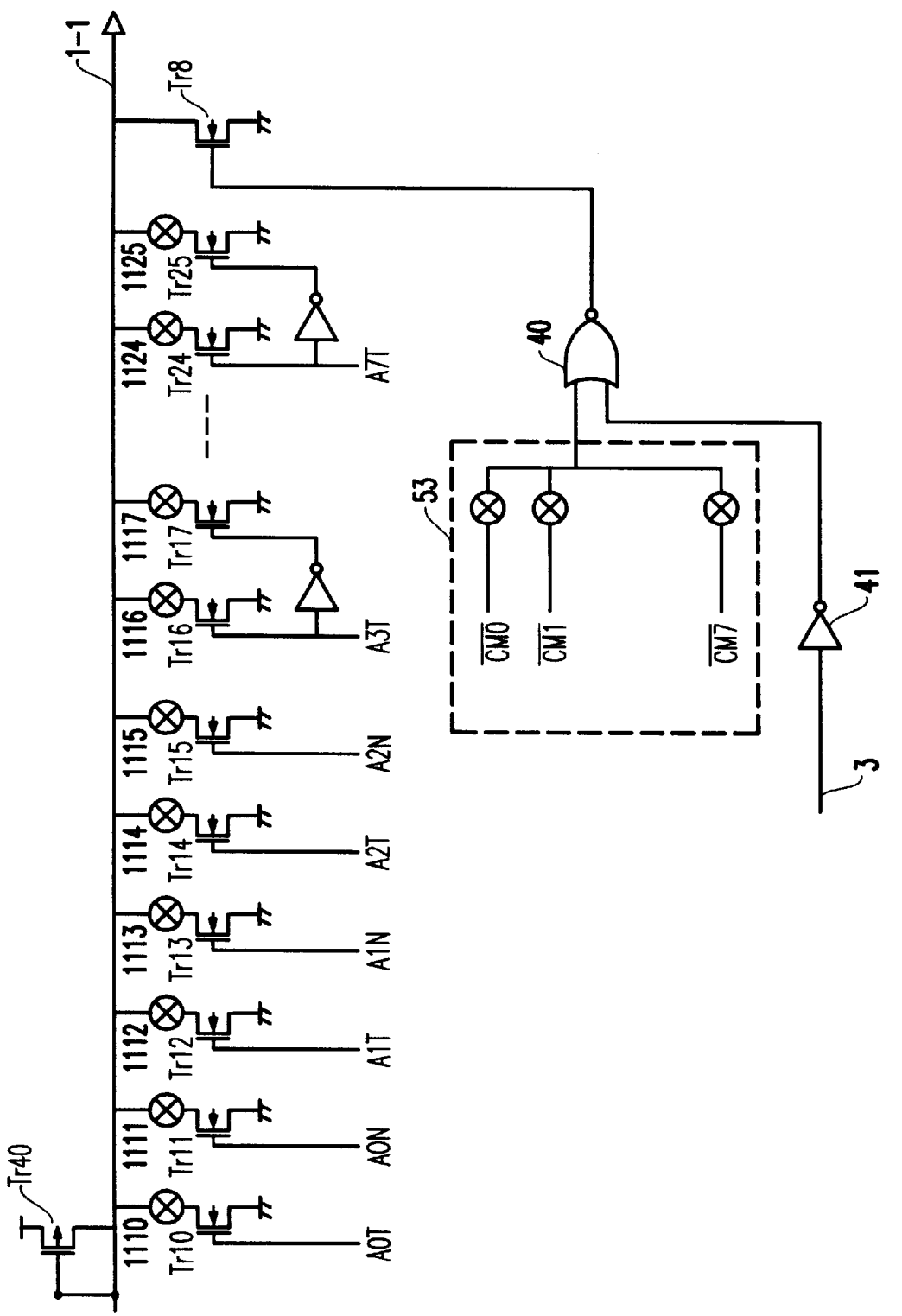
FIG. 5 is a circuit diagram showing a redundancy judging circuit 110-1 of a second embodiment according to the present invention.

A second embodiment of the redundancy judging circuit according to the present invention is shown in FIG. 5 and described below. The structure of circuit 110-1 shown in FIG. 5 is representative of all circuits 110-1–110-8 since such circuits have the same construction as shown in FIG. 5. A difference between the first and second embodiments is that column mask signal receiving circuit 53 of FIG. 5 is different from column mask signal receiving circuit 52 in FIG. 4.

In the second embodiment, the circuit 53 receives inverted column mask signals CM0–CM7. Therefore, preferably the chip 100 receives the inverted signals CM0–CM7 in addition to the signals CM0–CM7, or includes an inverting circuit therein for inverting the signals CM0–CM7.

An advantage of the structure of the second embodiment over that of the first embodiment is that a simpler circuit design results which takes up less chip "real estate".

Figure 6:
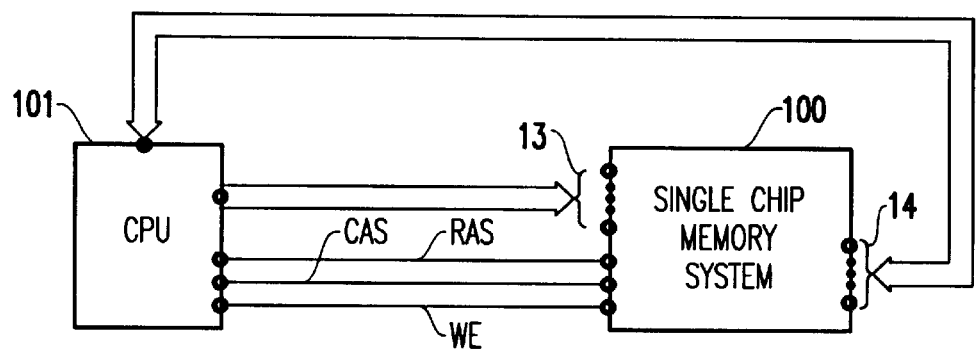
FIG. 6 is a diagram showing a connection relationship between a central processing unit (CPU) 101 and chip 100.
Figure 7:
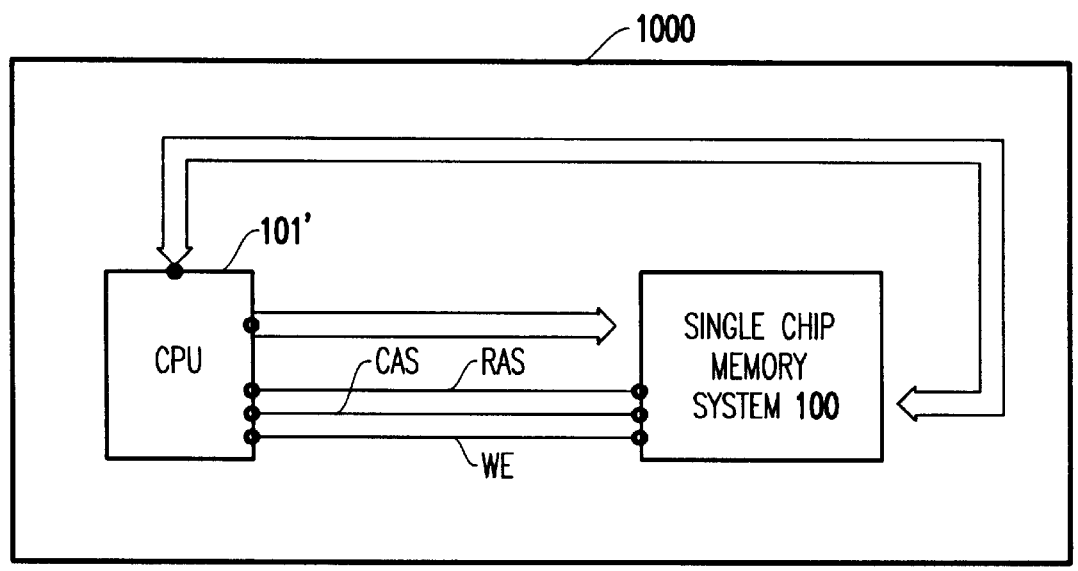
FIG. 7 is a diagram showing a semiconductor chip containing a CPU and the structure of the chip 100 except for terminals.

FIG. 6 shows the connection relationship between an external CPU 101 and the chip 100. The chip 100 is operated by external CPU 101 because the chip 100 has no on-board CPU. However, the memory system may be modified to contain an on-board CPU 101' as shown in FIG. 7. In this case, all structure except for the terminals in the chip 100 and CPU 101' are contained in a single semiconductor chip 1000.

As mentioned above, the chip 100 (and 1000) has eight redundancy judging circuits 110-1–110-8, eight bit line activators 10-1–10-8 and column decoder 120 receiving eight signals 1-11–1-81 because eight bit lines B0–B7 are chosen by the decoder 120 during the block writing operation. However, as known by one of ordinary skill in the art taking the present specification as a whole, the number of bits and thus the number of the above-mentioned structures can be changed depending on the design of the memory system.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory system for performing a block writing operation, comprising:
    an array of main memory cells including a plurality of bit lines;
    an array of redundant memory cells including a plurality of bit lines; and
    bit line activation means for activating at least one bit line of the array of main memory cells and at least one bit line of bit lines of the redundant memory cells simultaneously during the block writing operation, such that data is writeable to both said array of main memory cells and said array of redundant memory cells simultaneously during the block writing operation when an address signal indicates a redundant address,
    wherein all respective memory cells of said main memory cells determined to be usable are activated by said bit line activation means and only a bit line of said main memory cells judged to be defective is replaced by a bit line of said redundant memory cells during the block writing operation.

2. The memory system as recited in claim 1, wherein said bit line activation means comprises:
    redundancy judging means for receiving a plurality of address signals to judge a redundant address, for outputting a plurality of judging signals and for changing at least one of the judging signals from an inactive level to an active level when the address signals represent the redundant address during the block writing operation;
    a plurality of bit line activators, respectively corresponding to said plurality of judging signals and said bit lines of the array of redundant memory cells, for activating a corresponding bit line of the array of redundant memory cells when a corresponding judging signal has an active level;
    decoding means for decoding the address signals, for selecting a plurality of bit lines of the array of main memory cells in response to a result of the decoding, for receiving the judging signals respectively corresponding to selected bit lines, and for activating the selected bit lines other than at least one bit line of the bit lines of said array of main memory cells when the judging signal corresponding to the at least one bit line has the active level during the block writing operation.

3. The memory system as recited in claim 2, wherein said redundancy judging means comprises:
    a plurality of judging circuits respectively corresponding to the judging signals, for receiving the address signals to judge the redundant address, and for changing the corresponding judging signal to the active level when the address signals represent the redundant address; and
    a judging circuit activator for activating all of said judging circuits to change the judging signals to the active level during the block writing operation, and for not activating the judging circuits, other than one of said judging circuits, to maintain the judging signals thereof to the inactive level during an operation other than the block writing operation.

4. The memory system as recited in claim 3, wherein said decoding means receives mask signals for inactivating at least one bit line of the selected bit lines corresponding to an address that the mask signals represent regardless of a level of the judging signals during the block writing operation.

5. The memory system as recited in claim 4, wherein each of said judging circuits receives the mask signals for inactivating respective judging signals regardless of a level of the address signals.

6. The memory system as recited in claim 5, wherein said judging circuit comprises:
    an address signal receiving circuit, connected to an output line, for outputting the judging signal, for receiving the address signals, for making the judging signal have the active level when the address signals represent the redundant address and for making the judging signal have the inactive level when the address signals represent an address other than the redundant address; and
    a mask signal receiving circuit connected to the output line for making the judging signal the inactive level during the block writing operation in response to a predetermined condition.

7. The memory system as recited in claim 6, wherein said mask signal receiving circuit comprises:
    a first metal oxide semiconductor (MOS) transistor having a source-drain path between the output line and a reference voltage source;
    a NOR circuit having a plurality of inputs, and an output connected to a gate of the first MOS transistor;
    an invertor for receiving a block writing signal and having an output connected to one of said plurality of inputs of the NOR circuit;
    a fuse line connected to the other of said plurality of inputs of the NOR circuit;
    precharge means for precharging the fuse line;
    a plurality of second MOS transistors each having a gate for receiving respective mask signals and connected between the fuse line and a reference voltage source; and
    a plurality of fuses corresponding to the second MOS transistors connected between the fuse line and a source-drain path of the second MOS transistors,
    wherein all of said fuses are uncut when a bit line of the selected bit lines has an abnormality, and all of said fuses are cut when a bit line of the selected bit lines is devoid of said abnormality.

8. The memory system as recited in claim 7, wherein the first and the second MOS transistors each comprise an N-type MOS transistor.

9. The memory system as recited in claim 8, wherein the memory system is formed on a single semiconductor chip.

10. The memory system as recited in claim 9, wherein the memory system is operated by an off-chip central processing unit (CPU).

11. The memory system as recited in claim 9, further comprising a central processing unit (CPU) on said single semiconductor chip.

12. The memory system as recited in claim 1, wherein the memory system is formed on a single semiconductor chip.

13. The memory system as recited in claim 12, wherein the memory system is operated by an off-chip central processing unit (CPU).

14. The memory system as recited in claim 12, further comprising a central processing unit (CPU) on said single semiconductor chip.

15. A judging circuit for a memory system for performing a block writing operation, comprising:
    an address signal receiving circuit, connected to an output line, for outputting a judging signal, for receiving address signals, for making the judging signal have an active level from an inactive level when the address signals represent a redundant address and for making the judging signal have an inactive level when the address signals represent an address other than the redundant address; and a mask signal receiving circuit, connected to the output line, for making the judging signal have the inactive level during the block writing operation in response to a predetermined condition, wherein said memory system includes an array of main memory cells and an array of redundant memory cells, and data is writeable to both said array of main memory cells and said array of redundant memory cells simultaneously during the block writing operation when an address signal indicates a redundant address, and wherein all respective memory cells of said main memory cells determined to be usable are activated and only a bit line of said main memory cells judged to be defective is replaced by a bit line of said redundant memory cells during the block writing operation.

16. The judging circuit as recited in claim 15, wherein said mask signal receiving circuit comprises:

a first metal oxide semiconductor (MOS) transistor having a source-drain path between the output line and a reference voltage source;

a NOR circuit having a plurality of inputs, and an output connected to a gate of the first MOS transistor;

an invertor for receiving information that the block writing operation is started by the memory system and having an output connected to one of said plurality of inputs of the NOR circuit;

a fuse line connected to the other of said plurality of inputs of the NOR circuit;

precharge means for precharging said fuse line;

a plurality of second MOS transistors each having a gate for receiving respective mask signals and connected between said fuse line and a reference voltage source; and.

a plurality of fuses corresponding to said second MOS transistors connected between said fuse line and a source-drain path of said second MOS transistors, wherein at least one of the mask signals is activated during the block writing operation, all of said fuses are maintained when a bit line of the selected bit lines has an abnormality, and all of said fuses are cut when a bit line of the selected bit lines is devoid of said abnormality.

17. The judging circuit as recited in claim 16, wherein the first and the second MOS transistors each comprise an N-type MOS transistor.

18. A decoder for a memory system for performing a block writing operation and including a memory array having a plurality of bit lines and memory cells, the decoder comprising:

a decoding circuit for decoding address signals each having a higher portion and a lower portion;

a selecting circuit for selecting at least one bit line of said plurality of bit lines in response to a result of decoding the higher portion during the block writing operation; and an activating circuit for receiving judging signals respectively corresponding to selected bit lines, and for activating the selected bit lines other than at least one bit line of the bit lines when the judging signal corresponding to the at least one bit line has an active level during the block writing operation, wherein said memory system includes an array of main memory cells and an array of redundant memory cells, and data is writeable to both said array of main memory cells and said array of redundant memory cells simultaneously during the block writing operation when an address signal indicates a redundant address, and wherein all respective memory cells of said main memory cells determined to be usable are activated and only a bit line of said main memory cells judged to be defective is replaced by a bit line of said redundant memory cells during the block writing operation.

19. The decoder as recited in claim 18, wherein the activating circuit receives mask signals and inactivates at least one bit line of the selected bit lines based on the mask signals, regardless of a level of the judging signals.

20. The decoder as recited in claim 19, wherein the activating circuit receives information regarding whether the block writing operation is started, and disregards the judging signals other than one of the judging signals when the block writing operation is not executed, and wherein said activating circuit activates only one bit line according to the address signals when the block writing operation is not started and the one of the judging signals has an active level.

* * * * *